United States Patent [19]
Cameron et al.

[11] Patent Number: 4,839,679
[45] Date of Patent: Jun. 13, 1989

[54] DUAL VOICE COIL SHUTTER

[75] Inventors: John F. Cameron, Mountain View; Jeffrey G. Knirck, Sunnyvale; Lawrence A. Wise, Los Altos, all of Calif.

[73] Assignee: General Electric Corp., Stamford, Conn.

[21] Appl. No.: 64,151

[22] Filed: Jun. 18, 1987

[51] Int. Cl.$^4$ .............................................. G03B 9/62
[52] U.S. Cl. .................................................. 354/234.1
[58] Field of Search ...................................... 354/234.1

[56] References Cited

U.S. PATENT DOCUMENTS

| | | | |
|---|---|---|---|
| 660,006 | 10/1900 | Doyen | 354/265 X |
| 3,575,097 | 4/1971 | Gonzalez | 354/236 |
| 4,033,693 | 7/1977 | Payhammer et al. | 354/234.1 X |
| 4,060,313 | 11/1977 | Kondo | 354/234.1 X |
| 4,302,090 | 11/1981 | Kiuchi et al. | 354/234.1 |
| 4,333,722 | 6/1982 | Lee | 354/234.1 |
| 4,564,278 | 1/1986 | Ohmura | 354/234.1 X |

*Primary Examiner*—Michael L. Gellner
*Attorney, Agent, or Firm*—Flehr, Hohbach, Test, Albritton & Herbert

[57] ABSTRACT

A dual voice coil shutter is disclosed. The shutter mechanism is utilized in a stepper system, a laser system, or other carefully channeled light device to provide for opening and closing upon an optical path. The present invention is particularly useful for controlling passage of light hitting a photoresistive wafer through a reticle in a stepper system.

The present invention provides a shutter type mechanism rotatably mounted about a common axis where the mechanism includes a pair of blades having a scissors-like arrangement adapted to simultaneously open and close upon an optical path. A voice type coil means is provided for each of the blades such that when a DC electrical current is applied to the coils, a rotation of the blades is effected about a single axis of rotation in a predetermined period of time. The rotation of the coils is coplanar. The present invention provides for net torque to the system that is in effect zero, which produces little or no mechanical operation in the rest of the structure which could otherwise cause inaccuracy in the mechanical positioning or delayed process time while waiting for oscillations to die out.

6 Claims, 6 Drawing Sheets

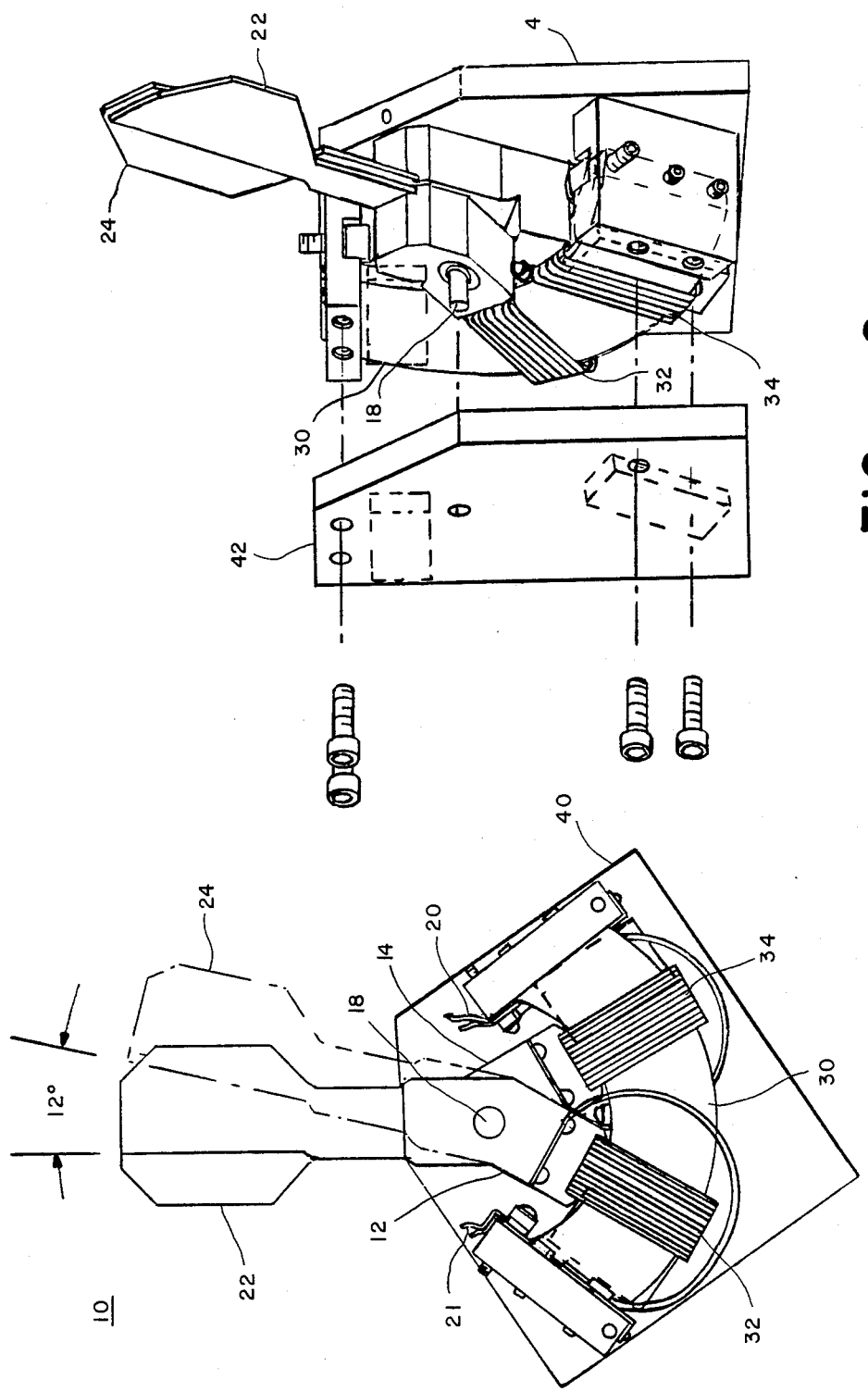

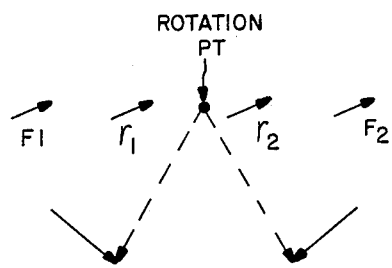
FIG.—3A
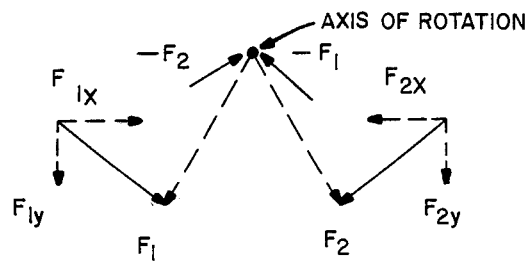
FIG.—3B
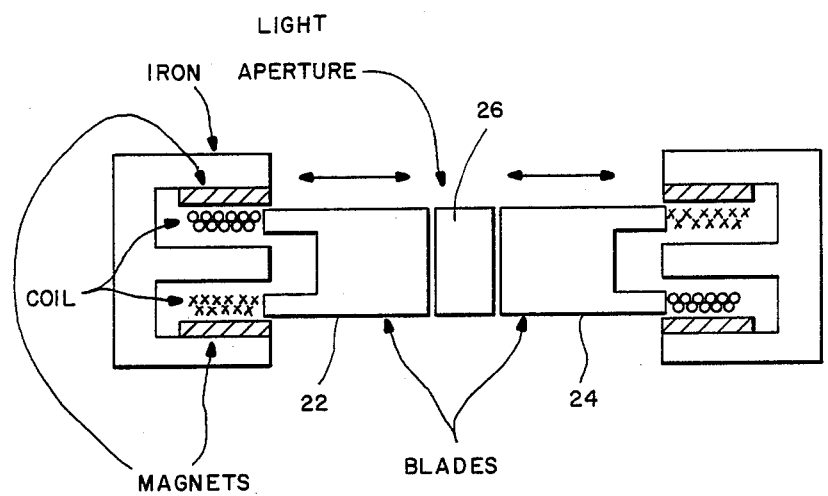
FIG.—6

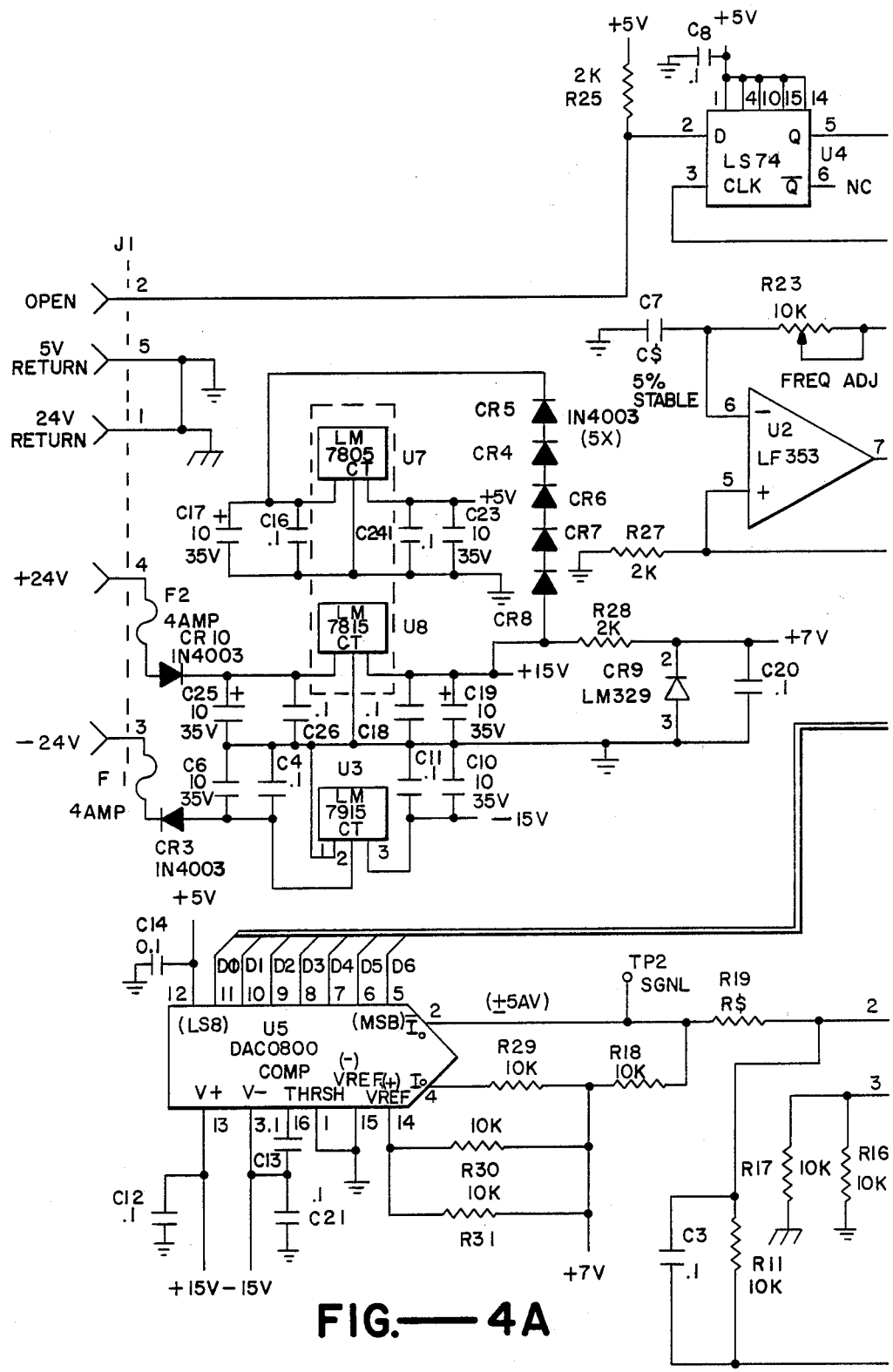
FIG.—4A

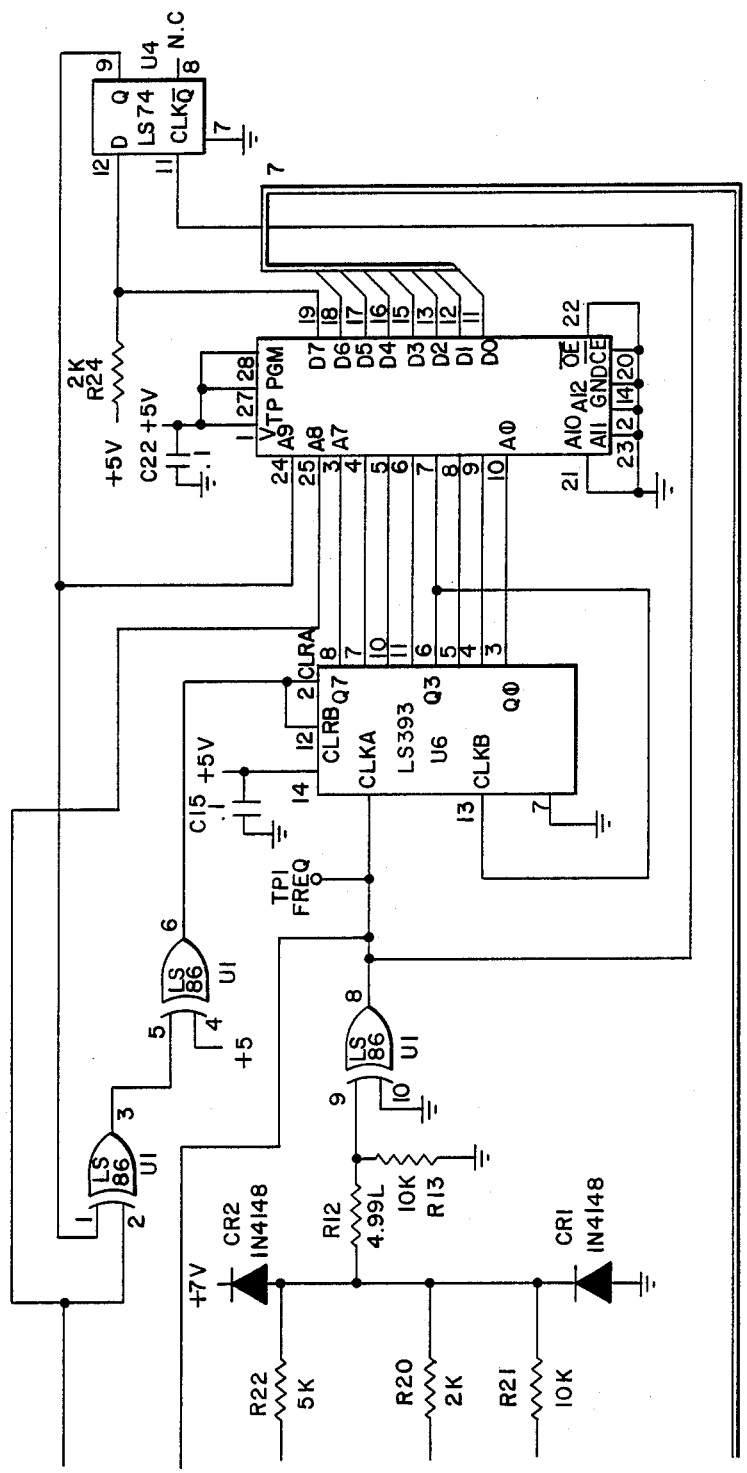
FIG.—4B

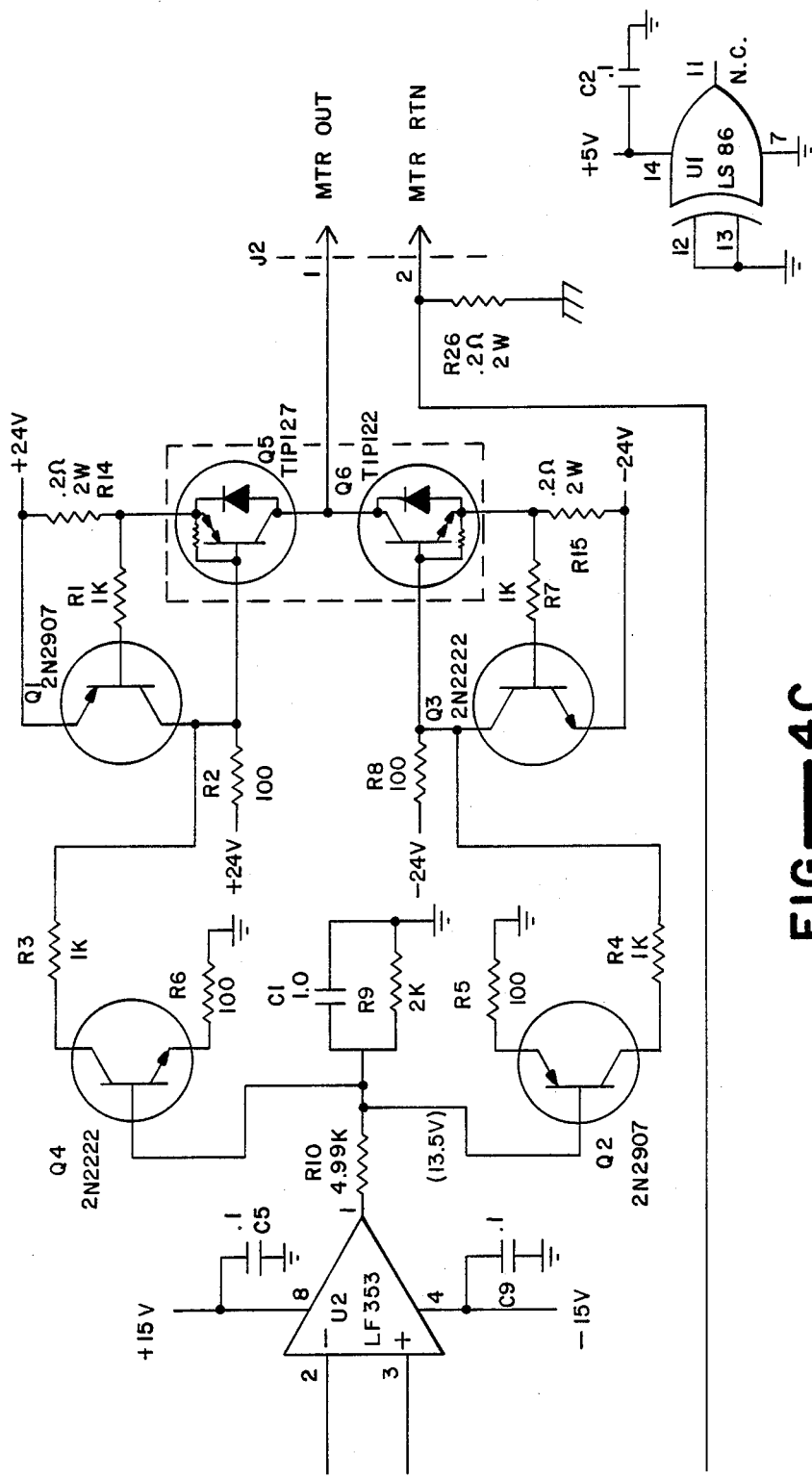
FIG.—4C

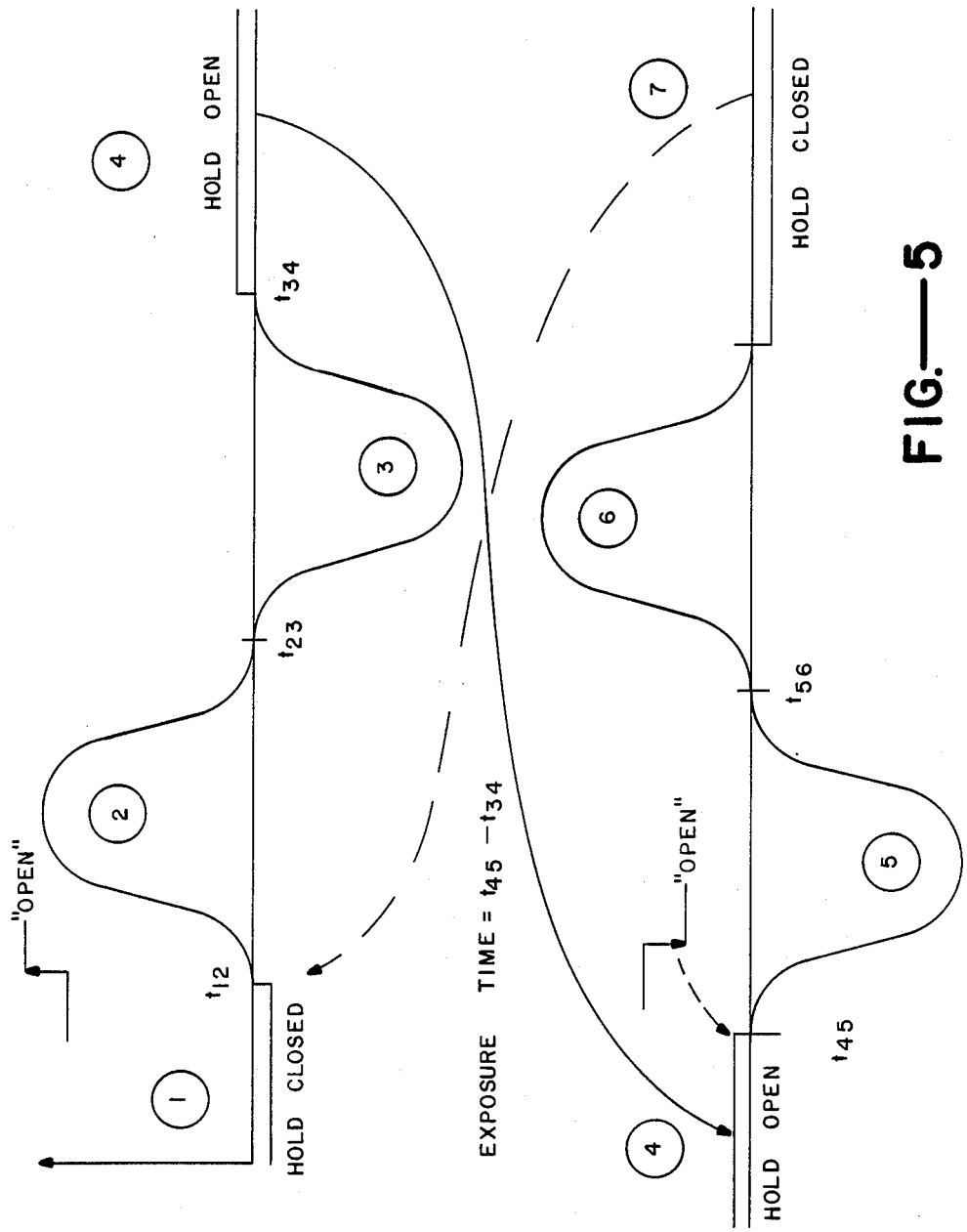
FIG.—5

DUAL VOICE COIL SHUTTER

BACKGROUND OF THE INVENTION

The present invention relates to a dual voice coil shutter for use in a stepper system, a laser system, and other carefully channeled light devices.

Steppers are well known systems which provide for accurately forming patterns on semiconductor wafers. Such systems are described, for example, in U.S. Pat. Nos. 4,311,494, 4,444,492 and 4,425,037, all of which are commonly assigned to the same assignee as the present invention.

In a stepper environment, it is necessary to accurately control the passage of light hitting a photoresistive wafer through what is known as a reticle. This is frequently implemented with some form of a shutter configuration.

A problem in prior art shutter arrangements utilized in a stepper system is that mechanical oscillations in the structure could cause inaccuracies in mechanical positioning or in the delay of process time while waiting for the oscillations to die out.

Other problems which occur are that prior art shutter implementations require contacting parts that can wear out and cause friction in the activation of the shutter, asymmetric construction which includes different and/or more parts and, finally, a heavy mechanical mass which does not easily provide for fast actuation.

SUMMARY OF THE INVENTION

It is an object of the present invention to provide an improved shutter configuration for use in a stepper system.

It is a more particular object of the invention to provide a dual voice coil shutter for use in a stepper system.

Briefly, the improved shutter according to the present invention controls passage of light hitting, in one preferred environment, a photoresistive wafer through a reticle and includes a shutter type mechanism rotatably mounted about a common axis. The shutter mechanism includes a pair of blades having a scissors-like arrangement which is adapted to simultaneously open and/or close upon an optical path with appropriate control.

Each of the shutters includes a voice type coil means which can be actuated in a common plane and means for applying a DC electrical current to the coil means to effect a rotation about the single axis of rotation within a predetermined time.

The direction of rotation (which results in an opening or shutting of the shutters) depends upon the direction of the electrical current.

Other objects, features and advantages of the present invention will become apparent from the following detailed description when taken in conjunction with the accompanying drawings.

BRIEF DESCRIPTION OF THE DRAWINGS

FIG. 1 a side view of a dual voice coil shutter according to the present invention.

FIG. 2 depicts an isometric perspective view of the present invention.

FIGS. 3A and 3B depict force vector diagrams for describing the operation of the present invention.

FIGS. 4A, 4B and 4C a schematic diagram of a shutter driver for the invention of FIG. 1.

FIG. 5 depicts a timing diagram for describing a cycle of operation of the present invention.

FIG. 6 depicts a co-linear shutter according to the present invention.

DETAILED DESCRIPTION OF THE DRAWINGS

The present invention provides a dual voice coil shutter for use in a stepper type system, a laser system, or other carefully channeled light devices.

The present invention provides apparatus for controlling, in one environment, passage of light hitting a photoresistive wafer through a reticle.

The advantages of the present invention over the prior art include one aspect that during and after a mechanical actuation, the net torque to the system is, in effect, zero. Also, the net force is essentially negligible with respect to the operation of the present invention. This will produce little or no mechanical oscillations in the rest of the structure that would otherwise cause inaccuracy in mechanical positioning or delay in process time while waiting for the oscillations to die out.

Other advantages include no requirement of contacting parts that might wear out and cause friction in the actuation of the shutter, symmetric construction which means fewer different parts, and cheaper piece part prices, and a light mechanical mass driven by a strong motor, which provides for fast actuation.

FIG. 1 depicts a side view of the present invention. The present invention 10 can be compared to a scissors-like arrangement which includes two identical armatures 12, 14 rotatably mounted about the same shaft or axis 18. At the end of each armature 12, 14 is a blade 22, 24 that moves to cover or uncover one-half of an aperture used for the passage of light, which would hit, for example, a photoresistive wafer through a reticle. FIG. 6 depicts a better view of the movement of blades 22, 24 which cover or uncover an aperture 26.

At the other end of each armature are coils of wire 32, 34 used to conduct electrical current in a magnetic field. The magnetic field can be produced by permanent magnets in an iron frame which also contains the free ends of the shaft about which the armature is rotated. When a suitable current is applied to leads 20, 21 in FIG. 1, coils 32, 34 actuated to effect a movement in a plane common to the plane of core 30, as will be described.

FIG. 2 depicts an isometric perspective view of the present invention.

As seen in FIG. 2, the present invention includes base supports 40, 42 which can be affixed together for providing proper support by suitable screws or bolts.

The voice coils 32, 34 are oriented to move in a common plane about core 30. This provides for rotation about the common axis 18, which will enable operation of the present invention with little or no torque, which is a very desirable aspect.

The present invention also includes blades 22, 24 which correspond to voice coils 32, 34 respectively. The blades 32, 34 open and close about an aperture, as seen more clearly in FIG. 6.

In FIG. 2, base core 30 is formed of suitable magnetic type material so that when a suitable electrical current is applied to voice coils 32, 34, a proper and desired actuation of the voice coils is effected to bring about the desired opening and/or closing of the shutters 22, 24, as will be described.

The construction of the iron frame is important, because the same core of iron passes through the coil of each armature. Electrical current is directed through the two coils such that the force $$F = IM \times B$$

where
I = current
M = wire length
$\overline{B}$ = magnetic field
$\overline{F}$ = force generated on each coil produces equal and essentially opposite reactionary torques. This is the reason that no net torque is generated to the external structure.

The iron core is actually a segment of a circle in shape, so that the coils may move in a circle (in a common plane) about the axis of rotation of the armatures. As depicted in FIGS. 2A and 2B, the force vectors can be configured into X and Y components such that the net torque is effectively zero.

As depicted in FIG. 6, wherein a cross-sectional configuration of the present invention is depicted, little or no net force and no net torque would result, since the system is essentially co-linear and it would produce little or no net forces and no torques. It can be seen in FIG. 2B that the force components F1x and F2x cancel, and the components F1y and F2y add, such that there may be a net force, but no torque.

FIG. 4 depicts a schematic diagram of a suitable electrical driving circuit. An electrical driving circuit provides current, and hence force, and hence acceleration, and hence movement. The electrical current accelerates the armatures for the first one-half of the travel. At this point, the current switches direction, which deaccelerates the armatures for the rest of the travel. The result is that the armatures start and finish their travel with zero velocity and hence no net momentum is transferred.

The shutter arrangement according to the present invention includes a shutter type mechanism including a pair of blades which are rotatably mounted about a common axis. The blades have a scissors-like arrangement, as depicted in FIG. 1, and are adapted to simultaneously open and close upon an optical path.

Each of the shutters desirably includes a voice type coil means to provide a means for actuation in a common plane. Also, a suitable means for applying a DC electrical current to the coils is depicted in FIG. 4. By applying a DC electrical current to the coils, a rotation about the common axis is effected, such that the shutters open and/or close depending upon the direction of application of the electrical current, as will be described.

A cycle of operation of the present invention will now be described in conjunction with FIGS. 1, 2, 4 and 5.

In FIG. 4, voltage regulators U7, U8 provide the necessary voltages for the basic circuit operation. The OPEN signal is a control signal used to control the operation of the shutter blades 22, 24, as seen in FIG. 2. Oscillator U2 is used to control the rate at which memory U9 is addressed by counter U6 in a lookup table. Memory U9 contains a profile for smooth opening and closing of shutter blades 22, 24.

Oscillator U2 is always on, running continuously. The pulses go into counter U6. The pulses are input into counter U6 and the output of counter U6 is an increasing number. That number is used to form part of the address of the lookup table in memory chip U9. The remaining address lines for the lookup table are from one of the output lines seen as D7 on chip U9 (forming address bit A9). Also, the command line itself (the OPEN signal) is an input (forming address bit A8), so two bits of address come from the command OPEN and one of the output lines of the memory chip U9. The remaining bits of address A0 through A7 are coming from counter U6. There are four quadrants of memory in the memory U9, which relate to FIG. 5.

In FIG. 4, digital to analog (DAC) converter U5 takes the numbers coming out of the lookup table and converts them to an analog voltage. The analog voltage then forms an analog current command. The current command goes to U2, and op amp, and this then drives a power op amp Q1–Q4 to provide the motor current signal. The power circuitry of FIG. 4 provides the driving current for the coils in FIG. 2.

The current is also sensed with resistor R26 in FIG. 4, and feedback is then provided to U2, so that a command current is in fact realized in the voice coils of FIG. 2.

The four quadrants of memory U9 of FIG. 4 in the lookup table relate to FIG. 5. Assume that blades 22, 24 of FIG. 2 are typically in the closed position, so that a light passage is blocked off, and light is not able to pass through the blades, such as depicted in FIG. 2.

FIG. 5 shows a curve of commanded current vs. time. It is important to note that the numbers contained in the lookup table are actually indicative of torque, since the numbers go into a DAC U5, which creates a current command, and current is proportional to torque, and therefore one is actually providing a torque profile with the lookup table.

In FIG. 5, looking at area 1, assume blades 22, 24 are closed so that no light may pass through them. The blades would be there for an indefinite period of time, until at point T12 in FIG. 5. The OPEN control line in FIG. 4 logically goes high at time T12. When that goes high, at point T12 on FIG. 5, oscillator U2 is then allowed to start incrementing the counter U6, and counter U6 then begins to progressively address different memory locations in the lookup table U9.

This is the basis for the profiles as seen in FIG. 5, and in particular at time T12, it begins to accelerate the blades 20, 24 apart. They start moving apart, until finally at time T23 the acceleration changes sign. At that point, time 23, the blades are moving at their maximum velocity to open. The area 3 on FIG. 5 shows a torque of an opposite sign than the torque commanded with area 2, and this will slow the blades 22, 24 down, until finally at time T34, the blades are back to zero velocity, and in fact are at the end of their travel.

At time T23, the blades 22, 24 are at the midway point between the closed and open position. Time T34 then is the time at which the counter U6 has gone completely through its cycle, and in fact when the counter U6 reaches its maximum value just before it clocks over, the last commanded location in the lookup table U9 is such that D7 output on chip U9 in the memory lookup table comes back around and turns off the counter's ability to incrementally address the lookup table such that the lookup table is frozen on its last commanded state, and that commanded state happens to be represented in FIG. 5 as area 4. This is an area called "hold open", a small incremental torque which is just barely putting a very small force so as not to heat up coils 32, 34 or not to waste energy, but just enough to keep the blades permanently open until it is appropriate to close the shutter again.

The time that holds the shutters 22,24 open is called an exposure time for the present invention, and it is shown on FIG. 5 at the time between T45 and T34. At time T45, at the 0 end of exposure time, the sequence is initiated to close the blades 22, 24 again. This sequence is triggered again by the control bit labeled "open" in FIG. 4. The OPEN line now goes to a logic low level, and when that goes to a logic low, that signals counter U6 that it may again resume addressing different memory locations in chip U9.

The time counter U6 now goes through addressing sequences as it did before. However, upper address bit A8, which is also the OPEN command bit, is now a different value than it was before. The effect of this is to address different segments of memory. These segments contain the profiles as seen in areas 5 and 6 in FIG. 5, similar to areas 2 and 3 except in the reverse order, such that acceleration begins in a direction that closes the blades 22, 24, and that is seen as area 5. They reach a maximum negative velocity to close the blades at time T56, as shown in FIG. 5. Area 6 just deaccelerates the speed of blades 22, 24 so that they do not slam shut, that they close gently, so that again not to impose any unnecessary vibration to the structure itself, as seen in FIG. 2.

Area 7 in FIG. 5 is triggered by again the counter U6 reaching its maximum value, and then when it reaches its maximum value, the very last output in memory chip U9 is such as to feed back around and turn off counter U6, so that now the commanded output is again held at a constant value. This is position 7 on FIG. 5, showing a small current present only to hold the blades of the shutter closed, as FIG. 2 shows the blades being held closed. When commanding torque as a function of time, the present invention uses a Gaussian curve as opposed to a square wave or a sine wave, since a Gaussian curve has the narrowest spectral power band, meaning it is less likely to excite a mechanical resonance of any given frequency.

The shutters are adapted to simultaneously open and close on an optical path where the opening or closing is accomplished by direction of electrical current passing through the voice coils affixed to each shutter on opposite sides of the pivot from the blade. As the coils move together, the blades open, and as the coils move apart, the blades close.

There are no gears which could produce friction or wear out in the present invention.

The present invention is an open loop configuration, which switches current direction at a predetermined time that corresponds to the time at which the blades are one-half of the way through the stroke. A varying amount of current is utilized in time to gently accelerate and/or decelerate the opening and closing of the arms.

The present invention switches based upon time only, and relies upon the blades being in a correct position due to an essentially frictionless and no-wear characteristics. The present invention switches current direction as a function of elapsed time. A DC current driving the coils follows a look-up table to provide the capability of generating an optimal profile.

What is claimed is:

1. Apparatus for controlling passage of light comprising
    a core,
    a shutter type mechanism rotatably mounted about a common axis, said mechanism including a pair of blades having a scissors-like arrangement adapted to simultaneously open and close upon an optical path, said shutter mechanism including
    a pair of voice-type coil means each of which is connected to a respective one of said pair of blades,
    means for applying a DC electrical current to said coils to effect a coplanar rotation of said coil means about said core so as to rotate said blades between opened and closed positions about a single axis of rotation within a predetermined period of time where the rotation of said blades depends upon the direction of application of said electrical current.

2. The apparatus of claim 1 further including means for applying said DC current in one direction so as to accelerate the rotation of said coil means and said blades for one portion of the rotation travel time, and means for switching the direction of said current so as to deaccelerate the rotation of said coil means and said blades for the remainder of said rotation travel time.

3. In a channeled light device, apparatus for controlling passage of light hitting the photoresistive wafer through said device comprising
    a core,
    a shutter type mechanism rotatably mounted about a common axis, said mechanism including a pair of blades having a scissors-like arrangement adapted to simultaneously open and close upon an optical path, said shutter mechanism including
    a pair of voice-type coil means, each of which is connected to a respective one of said pair of blades,
    means for applying a DC electrical current to said coils to effect a rotation of said pair of blades between opened and closed portions about a single axis of rotation within a predetermined period of time to minimize torque and where the rotation of said blades depends upon the direction of application of said electrical current.

4. The apparatus as in claim 3 wherein said device is a stepper system.

5. The apparatus as in claim 3 wherein said device is a laser system.

6. Apparatus for use in a stepper system for controlling passage of light hitting a photoresistive wafer through a reticle comprising
    a core,
    a shutter type mechanism rotatably mounted about a common axis, said mechanism including a pair of blades having a scissors-like appeasement adapted to simultaneously open and close upon an optical path, said shutter mechanism including
    a pair of voice-type coil means each of which is connected to a respective one of said pair of blades,
    open loop control means for applying a DC electrical current to said coil means such that said coil means rotate in a common plane about said core to effect a rotation of said blades between opened and closed positions about a single axis of rotation within a predetermined period of time where the rotation of said blades depends upon the direction of application of said electrical current.

* * * * *

UNITED STATES PATENT AND TRADEMARK OFFICE
CERTIFICATE OF CORRECTION

PATENT NO. : 4,839,679

DATED : June 13, 1989

INVENTOR(S) : John F. Cameron, Jeffrey G. Knirck, Lawrence A. Wise

It is certified that error appears in the above—identified patent and that said Letters Patent is hereby corrected as shown below:

On the title page:
The correct Assignee is:

GENERAL SIGNAL CORPORATION,

Signed and Sealed this

Twenty-second Day of May, 1990

*Attest:*

HARRY F. MANBECK, JR.

*Attesting Officer*          *Commissioner of Patents and Trademarks*